（12) United States Patent
Nishimura et al.

(10) Patent No.: US 12,068,217 B2
(45) Date of Patent: Aug. 20, 2024

(54) FRAME MEMBER WITH A POROUS MATERIAL BETWEEN A SEMICONDUCTOR MODULE AND HEAT SINK

(71) Applicant: Mitsubishi Electric Corporation, Tokyo (JP)

(72) Inventors: Takashi Nishimura, Tokyo (JP); Hiroki Shiota, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 457 days.

(21) Appl. No.: 17/612,218

(22) PCT Filed: Jul. 26, 2019

(86) PCT No.: PCT/JP2019/029486
§ 371 (c)(1),
(2) Date: Nov. 18, 2021

(87) PCT Pub. No.: WO2021/019614
PCT Pub. Date: Feb. 4, 2021

(65) Prior Publication Data
US 2022/0310478 A1 Sep. 29, 2022

(51) Int. Cl.
*H01L 23/373* (2006.01)
*H01L 21/48* (2006.01)
(Continued)

(52) U.S. Cl.
CPC ........ *H01L 23/3733* (2013.01); *H01L 21/481* (2013.01); *H01L 21/4871* (2013.01);
(Continued)

(58) Field of Classification Search
CPC . H01L 21/481; H01L 21/4871; H01L 25/072; H01L 23/16; H01L 23/3121;
(Continued)

(56) References Cited

U.S. PATENT DOCUMENTS

2003/0090915 A1    5/2003   Nakamura et al.
2005/0230816 A1*  10/2005   Kurauchi ............ H01L 23/4334
                                              257/E23.092
(Continued)

FOREIGN PATENT DOCUMENTS

JP    2003-153554 A    5/2003
JP    2008-308576 A    12/2008
(Continued)

OTHER PUBLICATIONS

International Search Report and Written Opinion mailed on Oct. 15, 2019, received for PCT Application PCT/JP2019/029486, Filed on Jul. 26, 2019, 6 pages including English Translation.

*Primary Examiner* — Alonzo Chambliss
(74) *Attorney, Agent, or Firm* — XSENSUS LLP

(57) ABSTRACT

A semiconductor device includes a semiconductor module, an insulating resin layer, a frame member, and a heat sink. Insulating resin layer is bonded to semiconductor module and contains a first resin. Frame member is disposed to surround insulating resin layer, and includes a porous material. Heat sink and semiconductor module sandwich insulating resin layer and frame member. Frame member is compressed while being sandwiched between semiconductor module and heat sink. Insulating resin layer is filled in a region surrounded by semiconductor module, heat sink, and frame member. The first resin enters pores of the porous material.

17 Claims, 11 Drawing Sheets

(51) Int. Cl.
*H01L 23/00* (2006.01)
*H01L 23/16* (2006.01)
*H01L 23/31* (2006.01)
*H01L 23/367* (2006.01)
*H01L 23/433* (2006.01)
*H01L 23/495* (2006.01)
*H02P 27/08* (2006.01)

(52) U.S. Cl.
CPC .......... *H01L 23/16* (2013.01); *H01L 23/3121* (2013.01); *H01L 23/367* (2013.01); *H01L 23/4334* (2013.01); *H01L 23/49562* (2013.01); *H01L 24/32* (2013.01); *H01L 24/73* (2013.01); *H01L 24/84* (2013.01); *H01L 2924/181* (2013.01); *H02P 27/08* (2013.01)

(58) Field of Classification Search
CPC ... H01L 23/36; H01L 23/367; H01L 23/3733; H01L 23/4334; H01L 23/49562; H01L 24/32; H01L 24/45; H01L 24/48; H01L 24/73; H01L 24/83; H01L 24/84; H01L 2924/181

See application file for complete search history.

(56) References Cited

U.S. PATENT DOCUMENTS

| | | | |
|---|---|---|---|
| 2012/0091573 A1 | 4/2012 | Sasaki et al. | |
| 2013/0270684 A1* | 10/2013 | Negishi | H01L 24/27 174/257 |

FOREIGN PATENT DOCUMENTS

| | | | | |
|---|---|---|---|---|
| JP | 2012-84708 A | | 4/2012 | |
| JP | 2012-174965 A | | 9/2012 | |
| JP | 2017092056 A | * | 5/2017 | |
| JP | 2018026370 A | * | 2/2018 | ............. H01L 23/12 |

* cited by examiner

FRAME MEMBER WITH A POROUS MATERIAL BETWEEN A SEMICONDUCTOR MODULE AND HEAT SINK

CROSS-REFERENCE TO RELATED APPLICATION

The present application is based on PCT filing PCT/JP2019/029486, filed Jul. 26, 2019, the entire contents of which are incorporated herein by reference.

TECHNICAL FIELD

The present invention relates to a semiconductor device, a power conversion device, and a method of manufacturing the semiconductor device.

BACKGROUND ART

Conventionally, there is a semiconductor device including an insulating resin layer for bonding a power module and a heat sink. For example, in a semiconductor device disclosed in Japanese Patent Laying-Open No. 2012-84708 (PTL 1), a thermally conductive insulating resin sheet is disposed between a power module and a heat sink. The thermally conductive insulating resin sheet is compressed by being pressurized between the power module and the heat sink. A thickness of the thermally conductive insulating resin sheet is defined by a sheet thickness regulating member provided in the power module.

CITATION LIST

Patent Literature

PTL 1: Japanese Patent Laying-Open No. 2012-84708

SUMMARY OF INVENTION

Technical Problem

When the thermally conductive insulating resin sheet (insulating resin layer) is pressurized, voids contained in the thermally conductive insulating resin sheet (insulating resin layer) are suppressed. However, in the semiconductor device disclosed in PTL 1, when the thermally conductive insulating resin sheet (insulating resin layer) flows to a surrounding portion, a pressure decreases. Alternatively, when a pressing portion is supported by a convex material (sheet thickness regulating member), the thermally conductive insulating resin sheet (insulating resin layer) is no longer compressed. Thus, the thermally conductive insulating resin sheet (insulating resin layer) is not sufficiently pressurized between the power module (semiconductor module) and the heat sink. Therefore, the voids contained in the thermally conductive insulating resin sheet (insulating resin layer) are not sufficiently suppressed. If the voids contained in the thermally conductive insulating resin sheet (insulating resin layer) are suppressed, a voltage at which discharge occurs can be increased, but since the voids are not sufficiently suppressed, sufficiently high insulation performance cannot be obtained.

The present invention has been made in view of the above problem, and an object of the present invention is to provide a semiconductor device capable of improving insulation performance.

Solution to Problem

A semiconductor device of the present invention includes a semiconductor module, an insulating resin layer, a frame member, and a heat sink. The insulating resin layer is bonded to the semiconductor module and contains a first resin. The frame member is disposed so as to surround the insulating resin layer, and includes a porous material. The heat sink and the semiconductor module sandwich the insulating resin layer and the frame member. The frame member is compressed while being sandwiched between the semiconductor module and the heat sink. The insulating resin layer is filled in a region surrounded by the semiconductor module, the heat sink, and the frame member. The first resin enters pores of the porous material.

Advantageous Effects of Invention

In the semiconductor device of the present invention, the frame member is compressed while being sandwiched between the semiconductor module and the heat sink. Further, the insulating resin layer is filled in the region surrounded by the semiconductor module, the heat sink, and the frame member. The insulating resin layer is sufficiently pressurized, and thus the voids contained in the insulating resin layer are suppressed. The first resin enters the pores of the porous material. Voids contained in the first resin pass through the porous material, and thus the voids contained in the insulating resin layer are suppressed. This can improve the insulation performance of the semiconductor device.

DESCRIPTION OF EMBODIMENTS

Figure 1:
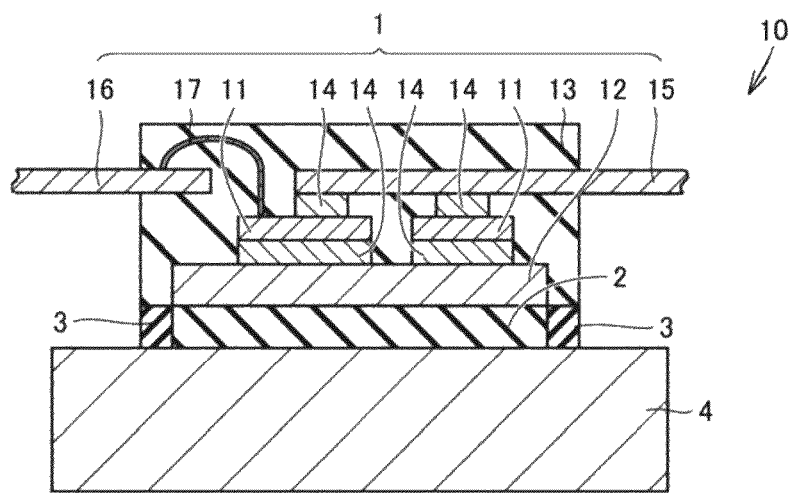
FIG. 1 is a schematic sectional view illustrating a configuration of a semiconductor device according to a first embodiment of the present invention.

Hereinafter, embodiments of the present invention will be described with reference to the drawings. In the following description, the same or corresponding parts are denoted by the same reference numerals, and redundant description will not be repeated.

First Embodiment

Figure 2:
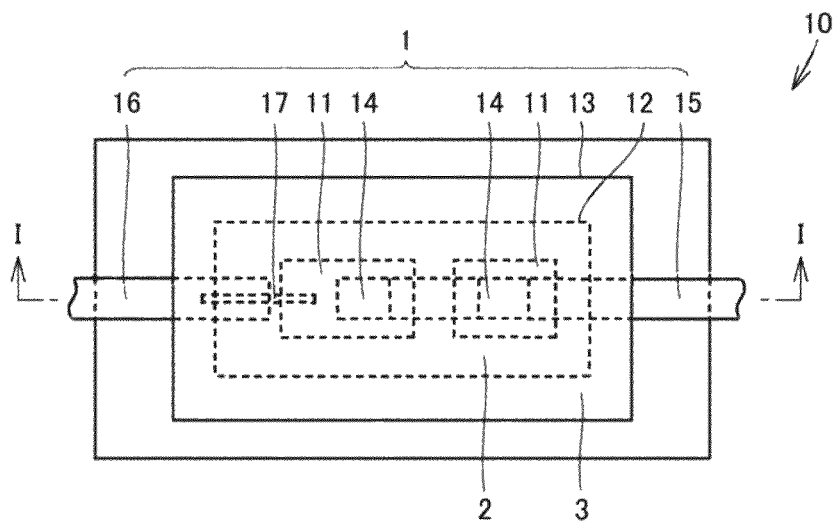
FIG. 2 is a schematic plan view illustrating a configuration of the semiconductor device according to the first embodiment of the present invention.

A configuration of a semiconductor device 10 according to a first embodiment will be described with reference to FIGS. 1 and 2. FIG. 1 is a schematic sectional view illustrating the configuration of semiconductor device 10 according to the first embodiment. FIG. 1 is a sectional view taken along line I-I in FIG. 2. FIG. 2 is a schematic plan view illustrating the configuration of semiconductor device 10 according to the first embodiment.

Semiconductor device 10 includes a semiconductor module 1, an insulating resin layer 2, a frame member 3, and a heat sink 4. Semiconductor device 10 is a power semiconductor device for electric power.

A first direction and a second direction are herein used as terms indicating directions. The first direction is a direction from semiconductor module 1 toward heat sink 4. The second direction is a direction orthogonal to the first direction. A plane orthogonal to the first direction is a second plane. The first direction is a so-called thickness direction. The second direction is a so-called in-plane direction.

Semiconductor module 1 includes a semiconductor element 11, a heat spreader 12, a sealing resin 13, a bonding material 14, a main terminal 15, a control terminal 16, and a control wire 17. A lower surface of semiconductor module 1 is formed by heat spreader 12 and sealing resin 13. Semiconductor module 1 is thermocompression-bonded to heat sink 4 with insulating resin layer 2 interposed therebetween. Thus, semiconductor module 1, insulating resin layer 2, and heat sink 4 are integrated. One semiconductor module 1 may include one semiconductor element 11 or a plurality of semiconductor elements 11.

Semiconductor element 11 is, for example, a silicon-type power semiconductor element such as an insulated gate bipolar transistor (IGBT) or a diode. Semiconductor element 11 is bonded to heat spreader 12 by bonding material 14. An upper surface of semiconductor element 11 is bonded to main terminal 15 with bonding material 14 interposed therebetween. Bonding material 14 is, for example, solder or a silver sintered material. The upper surface of semiconductor element 11 is bonded to control terminal 16 with control wire 17 interposed therebetween. Control wire 17 is, for example, a thin wire including aluminum (Al) or the like.

Heat spreader 12 is electrically connected to semiconductor element 11. Heat spreader 12 has heat dissipation properties. A material of heat spreader 12 is, for example, copper (Cu). Heat spreader 12 has a function as a lead frame.

Sealing resin 13 seals semiconductor element 11, heat spreader 12, sealing resin 13, bonding material 14, main terminal 15, control terminal 16, and control wire 17. In order to obtain reliability of semiconductor module 1, design of heat resistance, insulation, elastic modulus, linear expansion coefficient, and the like is important. Specifically, semiconductor element 11, heat spreader 12, and sealing resin 13 need to be appropriately designed.

Sealing resin 13 is, for example, an epoxy resin including a filler. The filler is dispersed inside the epoxy resin. A material of the filler is, for example, silica. Semiconductor element 11, heat spreader 12, and sealing resin 13 are installed in a mold and are transferred and molded to form an integrated module. Main terminal 15 and control terminal 16 may be partially exposed from sealing resin 13.

Insulating resin layer 2 is bonded to semiconductor module 1. Insulating resin layer 2 is filled in a region surrounded by semiconductor module 1, frame member 3, and heat sink 4. Insulating resin layer 2 contains a first resin 21. First resin 21 enters pores of a porous material of frame member 3.

Insulating resin layer 2 is in contact with the lower surface of semiconductor module 1. Insulating resin layer 2 is in contact with an entire surface of heat spreader 12 disposed on the lower surface of semiconductor module 1. The entire surface of insulating resin layer 2 is pressurized and heated to be thermocompression-bonded to semiconductor module 1 and heat sink 4. Insulating resin layer 2 has insulating properties and heat dissipation properties. Insulating resin layer 2 has a sheet shape. Insulating resin layer 2 is not constituted by a ceramic plate or heat dissipating grease having high thermal resistance. First resin 21 is a part of insulating resin layer 2 that has entered the pores of the porous material of frame member 3.

Insulating resin layer 2 contains, for example, a thermally conductive filler and a thermosetting resin. The thermally conductive filler has thermal conductivity. The thermally conductive filler is, for example, a sintered body or an aggregate. A material of the thermally conductive filler is, for example, boron nitride (BN), silicon nitride (SiN), alumina, or the like. The thermosetting resin is, for example, epoxy, polyimide, polyamide, or the like. A material of insulating resin layer 2 is a composite of the thermally conductive filler and the thermosetting resin.

As a method of forming a composite, the thermally conductive filler and the thermosetting resin formed in a particulate form in advance are kneaded. The kneaded thermally conductive filler and thermosetting resin are applied to a base material. The thermally conductive filler and the thermosetting resin applied to the base material are flattened. The flattened thermally conductive filler and thermosetting resin are then peeled off from the base material. Thus, insulating resin layer 2 having a sheet shape and being a composite of the thermally conductive filler and the thermosetting resin is formed. The base material includes, for example, a copper foil or polyethylene terephthalate (PET). A method of flattening the thermally conductive filler and the thermosetting resin is, for example, pressing.

In order to obtain more enhanced heat dissipation properties, a material in which the thermally conductive filler is oriented and a material in which a contact thermal resistance between the fillers is reduced may be used. Thermally conductive fillers having high thermal conductivity, such as boron nitride (BN), silicon nitride (SiN), and alumina, may be sintered in advance to increase a contact area between the fillers, and then gaps between the fillers may be filled with a resin. In this case, a contact state between the fillers can be improved, and thus, for example, a filling ratio of the resin can be arbitrarily changed by taking advantages of the high thermal conductivity of the fillers.

In insulating resin layer 2, a ceramic powder, an aggregate, or a sintered body is used as the thermally conductive filler, and for example, an epoxy resin is applied as the thermosetting resin. A ratio of the thermosetting resin is generally greater than or equal to 30 vol % and less than or equal to 60 vol %.

Insulating resin layer 2 before pressing contains voids therein. By pressing insulating resin layer 2, a size of voids contained in insulating resin layer 2 is reduced. When voids are contained in insulating resin layer 2, depending on conditions, the voids can serve as a starting point of partial discharge from semiconductor module 1 to heat sink 4 according to Paschen's law. When the partial discharge occurs, insulation performance of semiconductor device 10 is deteriorated. Therefore, the reliability of semiconductor device 10 decreases. The void here refers to a space in insulating resin layer 2, such as an air bubble or a crack. The crack means, for example, a gap between the thermosetting resin and the thermally conductive filler in insulating resin layer 2.

Frame member 3 is disposed so as to surround insulating resin layer 2. Frame member 3 includes the porous material. Frame member 3 is compressed while being sandwiched between semiconductor module 1 and heat sink 4. Frame member 3 as a whole may be constituted by the porous material.

Frame member 3 is deformable in the first direction. Frame member 3 is formed so as to surround an outer periphery of insulating resin layer 2. Frame member 3 is in contact with the lower surface of semiconductor module 1. Frame member 3 has a frame shape. Frame member 3 viewed from the first direction overlaps heat sink 4. Frame member 3 is not completely crushed and thus has a thickness. The thickness of frame member 3 is equal to a thickness of insulating resin layer 2. The thickness of insulating resin layer 2 as a whole is desirably equal to the thickness of frame member 3. In this case, the thickness of insulating resin layer 2 is uniform as a whole.

Heat sink 4 and the semiconductor module 1 sandwich insulating resin layer 2 and frame member 3. Semiconductor module 1 and heat sink 4 are stacked with insulating resin layer 2 and frame member 3 interposed therebetween. A material of heat sink 4 is a metal having high thermal conductivity, such as aluminum (Al) or copper (Cu).

Heat sink 4 may be configured such that a coolant (not illustrated) flows in heat sink 4. That is, heat sink 4 may be of a so-called water-cooling type. Heat sink 4 may be connected to a peripheral component such as a radiator such that the coolant flows through the peripheral component.

The material of heat sink 4 is metal. Heat sink 4 has conductivity. The material of heat spreader 12 is metal. Heat spreader 12 has conductivity. Heat spreader 12 is exposed from the lower surface of semiconductor module 1. That is, semiconductor module 1 is not electrically insulated. It is therefore necessary to electrically insulate semiconductor module 1 and heat sink 4 from each other. In a case where heat spreader 12 and heat sink 4 are not electrically insulated from each other, when a potential difference is generated between heat spreader 12 and heat sink 4 to cause a current to flow, the current also conducts to the peripheral component. As a result, there is a possibility that semiconductor module 1 may fail due to a short circuit with a ground.

Figure 3:
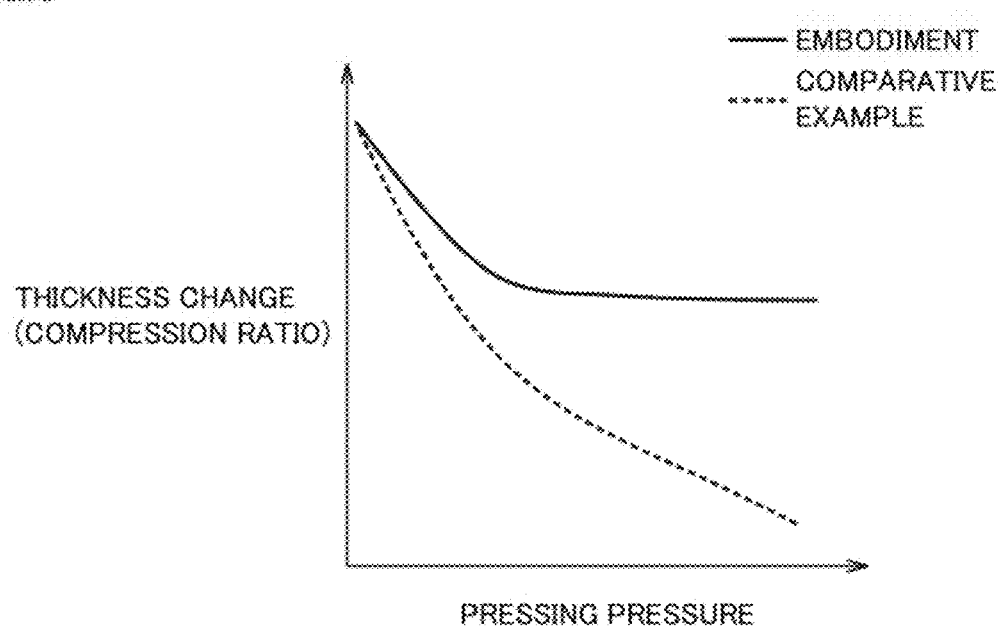
FIG. 3 is a schematic graph illustrating compression deformation characteristics of a frame member according to the first embodiment of the present invention.
Figure 4:
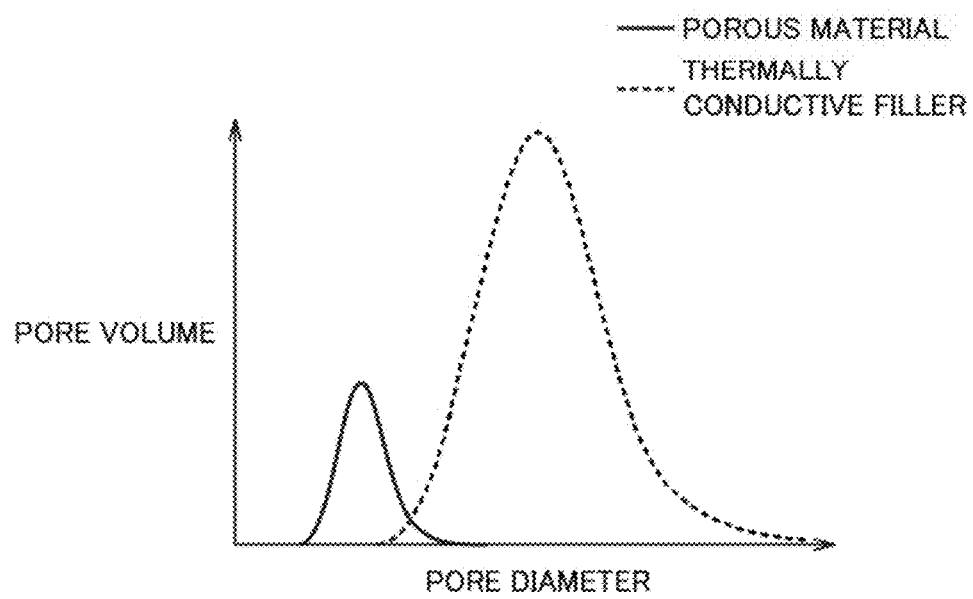
FIG. 4 is a schematic graph illustrating distribution of pores of a porous material and a thermally conductive filler according to the first embodiment of the present invention.

Next, frame member 3 will be described in detail with reference to FIGS. 3 and 4. FIG. 3 is a schematic graph illustrating a relationship between a pressing pressure and a thickness change (compression ratio) of frame member 3. FIG. 4 is a schematic graph illustrating a relationship between a pore diameter and a pore volume of the porous material and the thermally conductive filler.

A mechanical strength of frame member 3 has anisotropy. The mechanical strength herein refers to a compressive strength of a material. That the mechanical strength has anisotropy means that a magnitude of the compressive strength of the material varies depending on a direction. Frame member 3 has a first mechanical strength in a direction from semiconductor module 1 toward heat sink 4. Frame member 3 has a second mechanical strength in a plane orthogonal to the direction from semiconductor module 1 toward heat sink 4. The second mechanical strength is greater than the first mechanical strength. As a result, frame member 3 is easily compressed in the thickness direction and is hardly deformed in the in-plane direction.

Frame member 3 is configured such that the compression ratio decreases as frame member 3 is compressed in the thickness direction. That is, frame member 3 is configured such that the compression ratio decreases as frame member 3 is compressed in the first direction. The compression ratio of frame member 3 decreases as the pressing pressure increases. That is, when the pressing pressure is applied, the pores of the porous material are crushed and the porous material is compressed. Since a ratio of parts other than the pores of the porous material increases as the pores of the porous material are crushed, the compression ratio of the porous material decreases as the porous material is compressed. The porous material is not completely crushed. Further, in a bonding step S12 described later of the method of manufacturing semiconductor device 10, first resin 21 of insulating resin layer 2 enters the porous material of frame member 3. Thus, frame member 3 contains first resin 21. As frame member 3 is compressed, first resin 21 further enters the porous material. Therefore, as frame member 3 is compressed, first resin 21 decreases the compression ratio.

Frame member 3 has tensile strength in the in-plane direction. The tensile strength of frame member 3 is greater than or equal to 2 kg/mm$^2$. Functions and effects of the present embodiment are obtained by frame member 3 surrounding an entire periphery of insulating resin layer 2. Thus, when frame member 3 is pressurized, heated, and compressed, it is desirable that the frame member 3 has enough tensile strength not to break. Frame member 3 is pressurized and compressed in the thickness direction in a manufacturing step of semiconductor device 10. Frame member 3 compressed in the thickness direction is also deformed in the in-plane direction. When the tensile strength of frame member 3 is greater than or equal to 2 kg/mm$^2$, breakage of frame member 3 is suppressed when frame member 3 is deformed. An upper limit of the tensile strength is not provided as long as frame member 3 can be appropriately compressed.

The tensile strength herein refers to a tensile strength defined by JIS standard 8113. In JIS standard 8113, a test piece having a prescribed dimension is pulled at a constant speed until the test piece breaks, and thus the tensile strength is measured. The tensile strength is a ratio of an initial width of the test piece to an average value of maximum tensile loads.

Frame member 3 is an insulator. When frame member 3 is an insulator, frame member 3 may be in contact with heat spreader 12. When frame member 3 is a conductor, frame member 3 is not in contact with heat spreader 12, but is in contact with sealing resin 13.

The porous material is provided with the pores. The pores of the porous material have a volume ratio of the pores of the porous material and a pore diameter of the porous material. The volume ratio of the porous material is a ratio of a space formed by the pores of the porous material to a volume of frame member 3. The pore diameter of the porous material is an average inner diameter of the pores of the porous material.

Insulating resin layer 2 further includes the thermally conductive filler described above. The thermally conductive filler is a porous material. The thermally conductive filler has pores of the filler. The thermally conductive filler has a particle diameter of the filler and a pore diameter of the filler. The particle diameter of the filler is a particle diameter of the thermally conductive filler. The pore diameter of the filler is the average inner diameter of the pores formed in the thermally conductive filler. Thus, the pore diameter of the filler is smaller than the particle diameter of the filler. The thermally conductive filler has a volume ratio of the pores of the filler. The volume ratio of the pores of the filler is a ratio of a space formed by the pores of the filler to a volume of the filler.

The volume ratio of the porous material is smaller than a volume ratio of the filler. The pore diameter of the porous material is smaller than the particle diameter of the filler. The pore diameter of the porous material is smaller than the pore diameter of the filler.

A material constituting frame member 3 is at least one of natural fibers, glass fibers, polymer material fibers, inorganic fibers, or nonwoven fabrics. These are materials forming the porous material. Frame member 3 constituted by these materials can satisfy the above-described characteristics.

Figure 5:
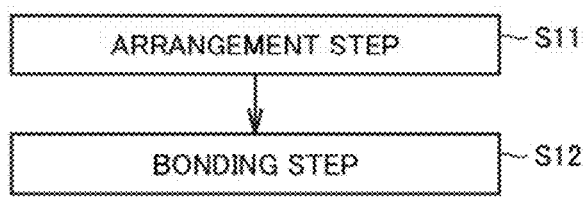
FIG. 5 is a flowchart illustrating a method of manufacturing the semiconductor device according to the first embodiment of the present invention.
Figure 6:
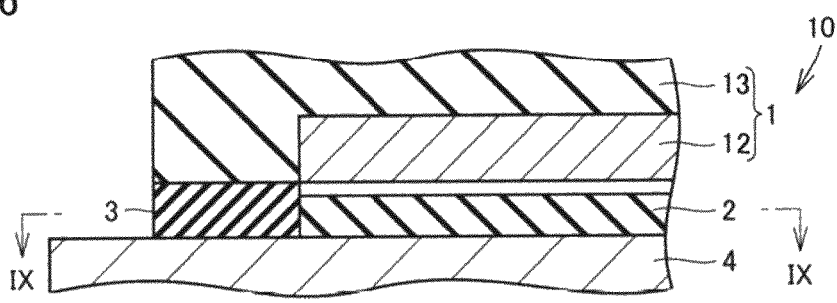
FIG. 6 is a schematic sectional view of the semiconductor device in a state in which an insulating resin layer, the porous material, and a semiconductor module are disposed on a heat sink in the method of manufacturing the semiconductor device according to the first embodiment of the present invention.
Figure 7:
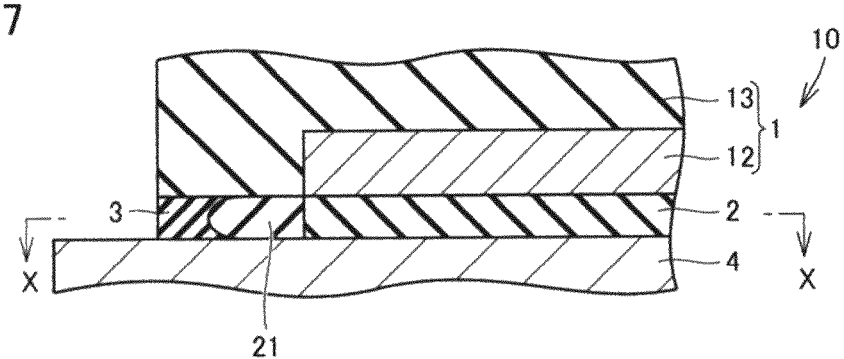
FIG. 7 is a schematic sectional view of the semiconductor device in a state in which the insulating resin layer and the porous material are pressurized between the semiconductor module and the heat sink in the method of manufacturing the semiconductor device according to the first embodiment of the present invention.
Figure 8:
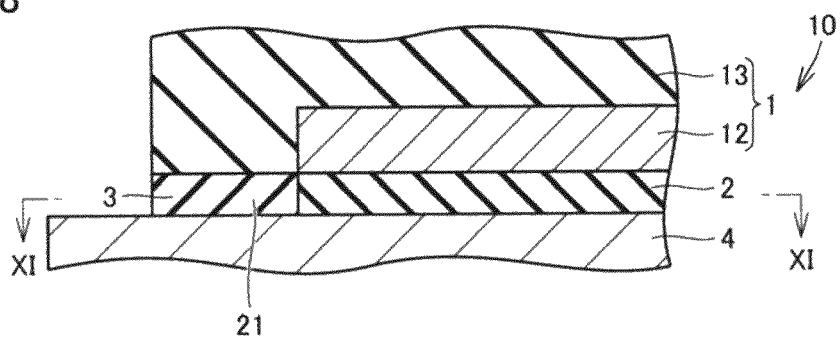
FIG. 8 is a schematic sectional view of the semiconductor device in a state in which the insulating resin layer is cured in the method of manufacturing the semiconductor device according to the first embodiment of the present invention.
Figure 9:
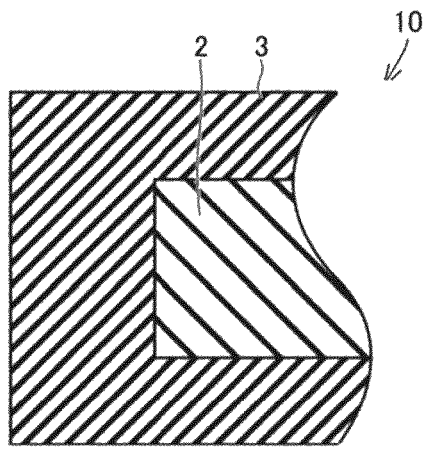
FIG. 9 is an end view taken along line IX-IX in FIG. 6.
Figure 10:
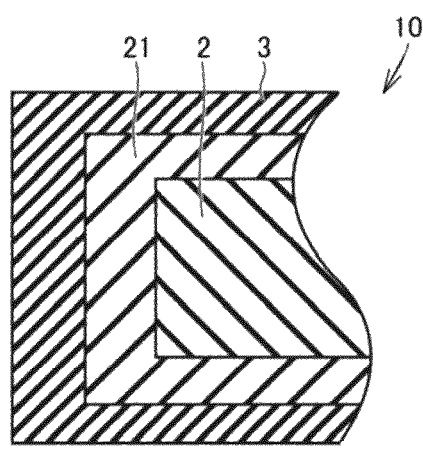
FIG. 10 is an end view taken along line X-X in FIG. 7.
Figure 11:
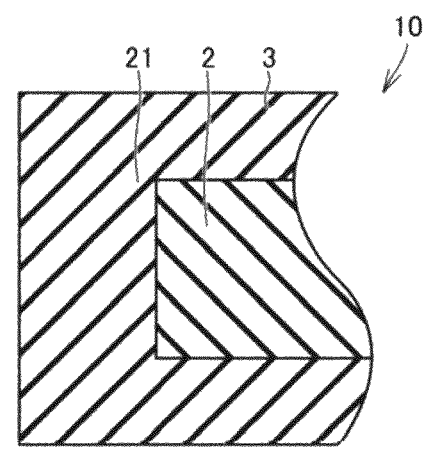
FIG. 11 is an end view taken along line XI-XI in FIG. 8.
Figure 12:
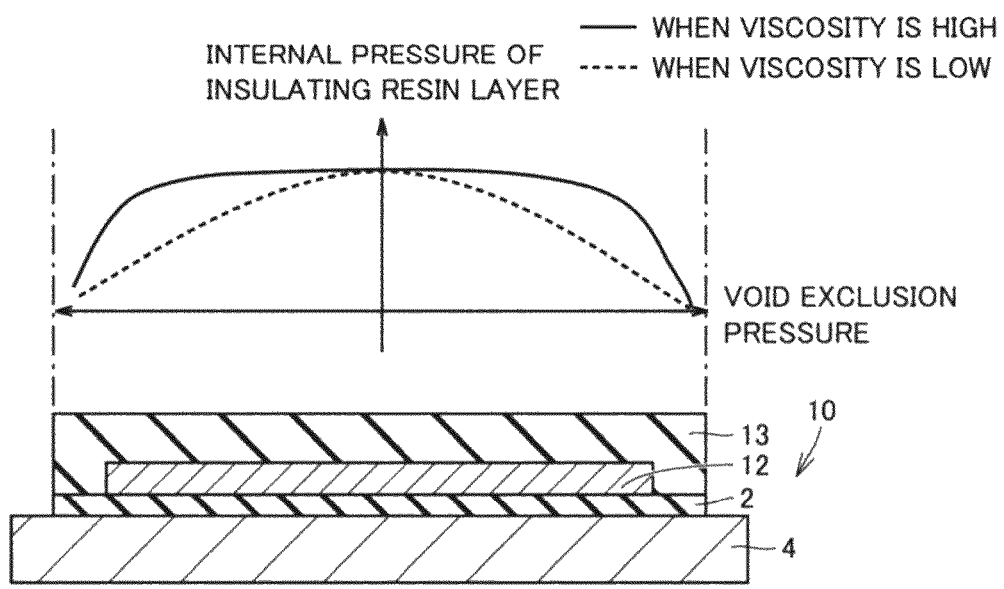
FIG. 12 is a schematic graph illustrating a relationship between an internal pressure of the insulating resin layer and a void exclusion pressure in Comparative Example when a viscosity is high and when the viscosity is low.

Next, a method of manufacturing semiconductor device 10 according to the present embodiment will be described with reference to FIGS. 5 to 12. FIG. 5 is a flowchart illustrating the method of manufacturing semiconductor device 10 according to the first embodiment. The method of manufacturing semiconductor device 10 according to the first embodiment includes an arrangement step S11 and bonding step S12. FIG. 6 is a schematic sectional view of semiconductor device 10 in a state in which insulating resin layer 2, frame member 3, and semiconductor module 1 are disposed on heat sink 4 in the method of manufacturing semiconductor device 10 according to the first embodiment. FIG. 7 is a schematic sectional view of semiconductor device 10 in a state in which insulating resin layer 2 and frame member 3 are pressurized by semiconductor module 1 in the method of manufacturing semiconductor device 10 according to the first embodiment. FIG. 8 is a schematic sectional view of semiconductor device 10 in a state in which insulating resin layer 2 is cured in the method of manufacturing semiconductor device 10 according to the first embodiment. FIG. 9 is an end view taken along line IX-IX in FIG. 6. FIG. 10 is an end view taken along line X-X in FIG. 7. FIG. 11 is an end view taken along line XI-XI in FIG. 8. FIG. 12 is a schematic graph illustrating a relationship between an internal pressure of insulating resin layer 2 and a void exclusion pressure in Comparative Example when a viscosity is high and when the viscosity is low.

In arrangement step S11, insulating resin layer 2 and frame member 3 are sandwiched between semiconductor module 1 and heat sink 4. Frame member 3 surrounds insulating resin layer 2 and includes the porous material.

As shown in FIG. 6, in arrangement step S11, the thickness of frame member 3 is larger than the thickness of insulating resin layer 2. Insulating resin layer 2 and frame member 3 are disposed on heat sink 4. An air layer may be provided between the lower surface of semiconductor module 1 and insulating resin layer 2. Insulating resin layer 2 may be or need not be in contact with an inner wall of frame member 3. In the present embodiment, frame member 3 as a whole is constituted by the porous material.

In bonding step S12, insulating resin layer 2 and frame member 3 are compressed. Semiconductor module 1 and heat sink 4 are bonded to insulating resin layer 2. Insulating resin layer 2 is filled in the region surrounded by semiconductor module 1, heat sink 4, and frame member 3. First resin 21 enters the pores of the porous material.

Insulating resin layer 2 and frame member 3 are compressed by being pressurized and heated. A method of pressurizing and heating insulating resin layer 2 and frame member 3 is, for example, hot pressing. Since insulating resin layer 2 and frame member 3 are sandwiched between semiconductor module 1 and heat sink 4 and compressed, the thickness of frame member 3 can be equal to the thickness of insulating resin layer 2. In bonding step S12, frame member 3 is compressed. Therefore, the thickness of frame member 3 in bonding step S12 is smaller than the thickness of frame member 3 in arrangement step S11. When insulating resin layer 2 and frame member 3 are pressurized, frame member 3 first comes into contact with semiconductor module 1, and then insulating resin layer 2 comes into contact with semiconductor module 1.

The viscosity of the pressurized and heated insulating resin layer 2 decreases. Insulating resin layer 2 having a low viscosity is in contact with frame member 3. An adhesive interface is formed in pressurized and heated insulating resin layer 2. Insulating resin layer 2 is bonded to semiconductor module 1 and heat sink 4 over the adhesive interface. As shown in FIG. 12, when the viscosity of insulating resin layer 2 is low in Comparative Example, insulating resin layer 2 flows, and this causes outflow of insulating resin layer 2 to a surrounding space. Therefore, a desirable void exclusion pressure cannot be obtained.

As shown in FIG. 7, insulating resin layer 2 having a low viscosity enters the pores of the porous material. First resin 21 is a part of insulating resin layer 2 that has entered the pores of the porous material. Insulating resin layer 2 is compressed and has a reduced volume. Thus, the thermosetting resin is extruded from insulating resin layer 2. The thermosetting resin extruded from insulating resin layer 2 enters the pores of the porous material. Since the porous material includes the pores, flow resistance inside the porous material is high. Thus, a pressure loss in first resin 21 flowing inside the porous material increases. The flow resistance suppresses the flow of first resin 21. Therefore, first resin 21 is held inside the porous material.

As illustrated in FIG. 8, subsequently, insulating resin layer 2 and first resin 21 are cured. After insulating resin layer 2 and first resin 21 are cured, compressed frame member 3 is not deformed.

Next, functions and effects of the present embodiment will be described.

In semiconductor device 10 according to the present embodiment, frame member 3 is compressed while being sandwiched between the semiconductor module 1 and heat sink 4. Further, insulating resin layer 2 is filled in the region surrounded by semiconductor module 1, heat sink 4, and frame member 3. Insulating resin layer 2 is sufficiently pressurized, and thus the voids contained in insulating resin layer 2 are suppressed. First resin 21 enters the porous material. Voids contained in first resin 21 pass through the porous material, and thus the voids contained in insulating resin layer 2 are suppressed. This can improve the insulation performance of semiconductor device 10.

Insulating resin layer 2 is filled in a pressurized state in the region surrounded by semiconductor module 1, frame member 3, and heat sink 4. Accordingly, the pressure on insulating resin layer 2 is maintained. Thus, the voids contained in insulating resin layer 2 are suppressed. Specifically, the voids are suppressed by being crushed by pressurization. Specifically, the voids are suppressed by sufficiently decreasing a void diameter by pressurization. Specifically, the voids are suppressed by moving from insulating resin layer 2 to the pores of the porous material by pressurization. Since the voids contained in insulating resin layer 2 are suppressed, the insulation performance of semiconductor device 10 is enhanced.

Figure 13:
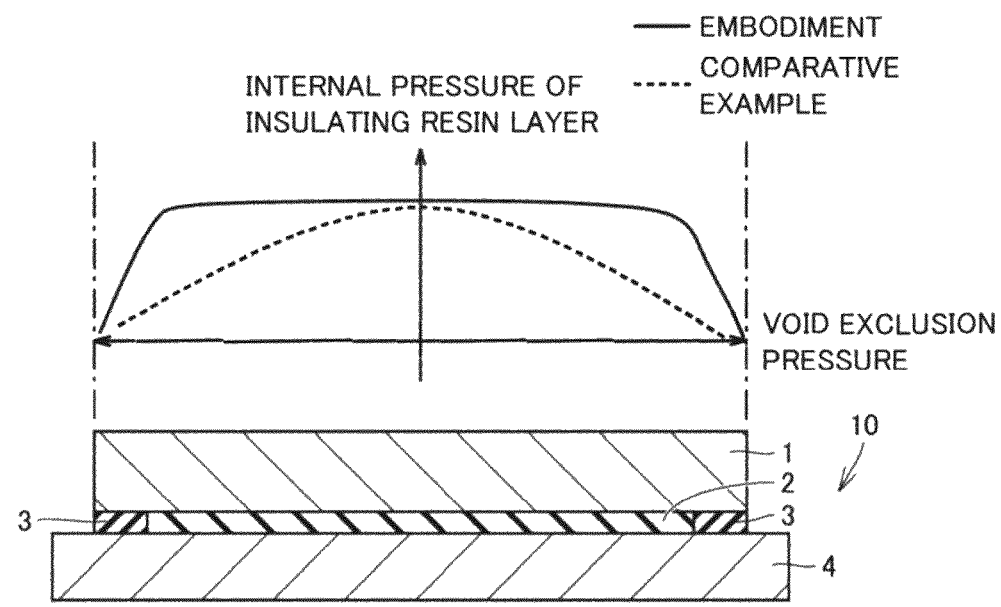
FIG. 13 is a schematic graph illustrating the relationship between the internal pressure of the insulating resin layer and the void exclusion pressure in the semiconductor device according to the first embodiment of the present invention and in Comparative Example.

Frame member 3 is disposed so as to surround insulating resin layer 2. This prevents insulating resin layer 2 from flowing out of frame member 3. The deformation of insulating resin layer 2 in the second direction can be controlled by frame member 3. Thus, insulating resin layer 2 can be pressurized with a higher pressure. A relationship between the internal pressure of insulating resin layer 2 and the void exclusion pressure will be described with reference to FIG. 13. FIG. 13 is a schematic graph illustrating the relationship between the internal pressure of the insulating resin layer and the void exclusion pressure in semiconductor device 10 according to the first embodiment and in Comparative Example. Since frame member 3 is disposed, the pressure can be applied to an end of insulating resin layer 2. Accordingly, the voids are suppressed.

Frame member 3 is sandwiched and compressed together with insulating resin layer 2 between semiconductor module 1 and heat sink 4. Thus, the thickness of insulating resin layer 2 can be equal to the thickness of frame member 3. Frame member 3 is compressed but not completely crushed. The thickness of insulating resin layer 2 can be regulated by frame member 3. Thus, the thickness of insulating resin layer 2 can be controlled by frame member 3.

Insulating resin layer 2 is surrounded by frame member 3 including the porous material. First resin 21 entering the porous material is prevented from flowing by the pores of the porous material. Insulating resin layer 2 is prevented from flowing out of frame member 3. Thus, the pressure on insulating resin layer 2 is maintained. For this reason, insulating resin layer 2 is pressurized up to the end. Since the voids are suppressed, the insulation performance of semiconductor device 10 is improved.

First resin 21 is held by the porous material. The flow resistance by the porous material is further increased by held first resin 21. Thus, insulating resin layer 2 is further prevented from flowing out of frame member 3. First resin 21 has a function as a so-called wet seal. Since first resin 21 is insulating, the insulation performance of frame member 3 is further enhanced.

The thickness of insulating resin layer 2 is regulated by the thickness of frame member 3. Since the thickness of insulating resin layer 2 is desirably uniform, the lower surface of semiconductor module 1 and an upper surface of heat sink 4 are desirably parallel to each other. Frame member 3 can be deformed. When at least one of the lower surface of semiconductor module 1 or the upper surface of heat sink 4 includes irregularities, and the irregularities are in contact with frame member 3, frame member 3 can be deformed following the irregularities. A contact surface between frame member 3 and semiconductor module 1 and heat sink 4 can be parallel to semiconductor module 1 and heat sink 4 as a whole. Then, frame member 3 having a uniform thickness is obtained. Therefore, insulating resin layer 2 having a uniform thickness is obtained.

In semiconductor device 10, insulating resin layer 2 is used instead of the insulating ceramic plate or the heat dissipating grease having high thermal resistance. This facilitates manufacturing, and enhances mass productivity. In addition, a manufacturing cost is thus reduced.

Since the second mechanical strength of frame member 3 is larger than the first mechanical strength, frame member 3 is easily compressed in the thickness direction and is hardly deformed in the in-plane direction. Since frame member 3 is easily compressed in the thickness direction, the thickness of insulating resin layer 2 is reduced. Thus, insulating resin layer 2 having excellent heat dissipation properties is obtained. Since frame member 3 is hardly deformed in the in-plane direction, stable insulation performance can be obtained.

Since frame member 3 is configured such that the compression ratio decreases as frame member 3 is compressed in the thickness direction, the thickness of frame member 3 can be stably controlled. Thus, the thickness of insulating resin layer 2 can also be stably controlled. Therefore, the insulation performance of semiconductor device 10 is stably enhanced.

Since the tensile strength of frame member 3 in the in-plane direction is greater than or equal to 2 kg/mm$^2$, frame member 3 is not broken when compressed. Therefore, the functions and effects of the present embodiment can be reliably exhibited.

Since frame member 3 is an insulator, insulation performance is maintained when frame member 3 and heat spreader 12 are in contact with each other. Thus, the insulation performance of semiconductor device 10 is improved. In addition, a degree of freedom of arrangement of each member of semiconductor device 10 is increased.

Since insulating resin layer 2 includes the thermally conductive filler, the heat dissipation properties of insulating resin layer 2 are enhanced. Heat dissipation properties from semiconductor module 1 to heat sink 4 are also enhanced. Therefore, heat dissipation properties of semiconductor device 10 is enhanced.

When the pore diameter of the porous material is small, the flow resistance of first resin 21 in the porous material increases. When the volume ratio of the pores of the porous material is small, a flow resistance of first resin 21 in the porous material also increases. In these cases, the pressure loss of first resin 21 entering the porous material increases. In the present embodiment, since the pore diameter of the porous material is smaller than the particle diameter of the filler and smaller than the pore diameter of the filler, the flow resistance is large. Since the volume ratio of the pores of the porous material is smaller than the volume ratio of the pores of the filler, the flow resistance is large. When insulating resin layer 2 is pressurized, first resin 21 of insulating resin layer 2 is further prevented from flowing out of frame member 3. Thus, since insulating resin layer 2 is easily held in frame member 3, insulating resin layer 2 is further pressurized up to the end. The pressure on insulating resin layer 2 is further maintained. Therefore, since the voids are suppressed, the insulation performance of semiconductor device 10 is further improved.

Since the material of frame member 3 is at least one of natural fibers, glass fibers, polymer material fibers, inorganic fibers, or nonwoven fabrics, the functions and effects of the present embodiment can be reliably obtained.

In the method of manufacturing semiconductor device 10 according to the present embodiment, insulating resin layer 2 is surrounded by frame member 3. When the viscosity of insulating resin layer 2 decreases in bonding step S12, the insulating resin layer 2 is held inside frame member 3, and thus insulating resin layer 2 is prevented from flowing out to the surrounding space. Then, insulating resin layer 2 is sufficiently pressurized. Therefore, the insulation performance of semiconductor device 10 is enhanced.

Second Embodiment

A second embodiment has the same configuration, manufacturing method, and functions and effects as the first embodiment unless otherwise specified. Therefore, the same components as those in the first embodiment are denoted by the same reference signs, and the description thereof will not be repeated.

In the semiconductor device 10 according to the present embodiment, the frame member 3 has a higher dielectric constant than the insulating resin layer 2.

Insulating resin layer 2 has a first dielectric constant. Frame member 3 has a second dielectric constant. In the second embodiment, the second dielectric constant is larger than the first dielectric constant. That is, frame member 3 is an insulating material having a higher dielectric constant than insulating resin layer 2. In the second embodiment, the material constituting frame member 3 is at least one of alumina or mullite. Alumina and mullite are ceramic materials. Alumina and mullite are inorganic fibers. The present embodiment has the functions and effects of the first embodiment. The material of frame member 3 may be a material having a high dielectric constant other than the above-described materials. The material of frame member 3 may be, for example, silicon nitride (SiN), aluminum nitride (AlN), zirconia (Zr), or the like.

Next, functions and effects of the present embodiment will be described.

In the present embodiment, frame member 3 having a higher dielectric constant than insulating resin layer 2 is disposed between the outside of frame member 3 (atmosphere) and insulating resin layer 2. As a result, an occurrence of creeping discharge is suppressed at a boundary between the outside of the frame member 3 and frame member 3 and at a boundary between frame member 3 and insulating resin layer 2. In the present embodiment, a so-called electric field relaxation effect can be obtained. Therefore, the insulation performance of semiconductor device 10 is enhanced.

Third Embodiment

A third embodiment has the same configuration, manufacturing method, and functions and effects as the first embodiment unless otherwise specified. Therefore, the same components as those in the first embodiment are denoted by the same reference signs, and the description thereof will not be repeated.

In the present embodiment, the method of manufacturing semiconductor device 10 further includes an impregnation step S13. In impregnation step S13, the pores of the porous material are impregnated with a second resin 31. In bonding step S12, first resin 21 is in contact with second resin 31. The method of manufacturing semiconductor device 10 according to the present embodiment is different from the method of manufacturing semiconductor device 10 according to the first embodiment in that the method further includes impregnation step S13.

Figure 14:
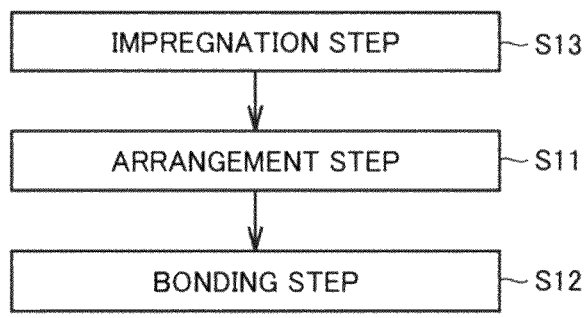
FIG. 14 is a flowchart illustrating a method of manufacturing a semiconductor device according to a third embodiment of the present invention.
Figure 15:
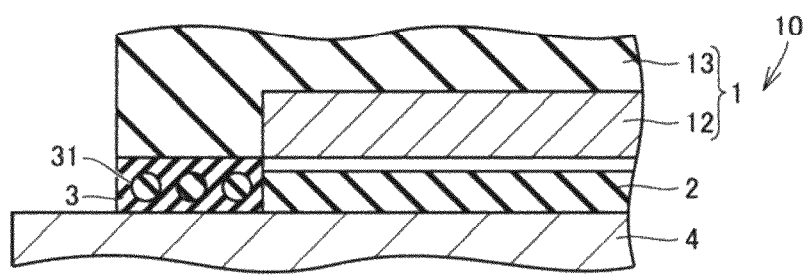
FIG. 15 is an end view corresponding to FIG. 6 in the method of manufacturing the semiconductor device according to the third embodiment of the present invention.
Figure 16:
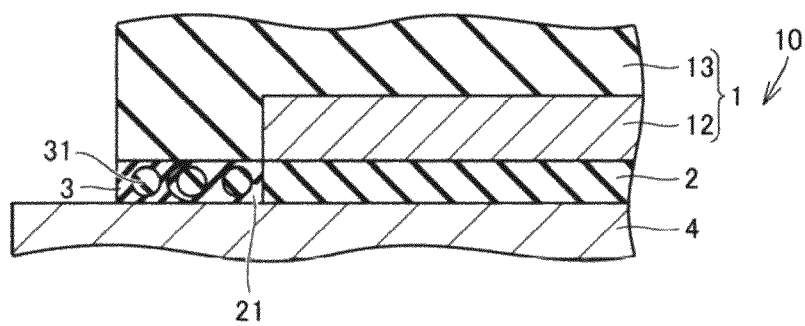
FIG. 16 is an end view corresponding to FIG. 7 in the method of manufacturing the semiconductor device according to the third embodiment of the present invention.
Figure 17:
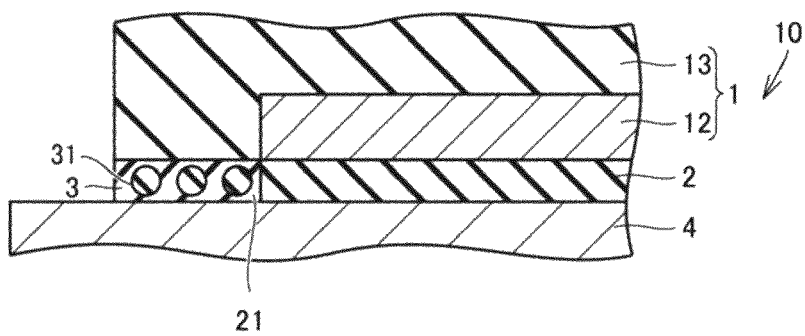
FIG. 17 is an end view corresponding to FIG. 8 in the method of manufacturing the semiconductor device according to the third embodiment of the present invention.

The method of manufacturing semiconductor device 10 according to the third embodiment will be described with reference to FIGS. 14 to 17. FIG. 14 is a flowchart illustrating the method of manufacturing semiconductor device 10 according to the third embodiment. FIG. 15 is an end view corresponding to FIG. 6 in the method of manufacturing semiconductor device 10 according to the third embodiment. FIG. 16 is an end view corresponding to FIG. 7 in the method of manufacturing semiconductor device 10 according to the third embodiment. FIG. 17 is an end view corresponding to FIG. 8 in the method of manufacturing semiconductor device 10 according to the third embodiment.

In the present embodiment, impregnation step S13 is performed before arrangement step S11. The pores of the porous material of frame member 3 are impregnated with second resin 31 in advance. Second resin 31 has adhesiveness and thermosetting properties. In bonding step S12, first resin 21 and second resin 31 are pressurized and heated. Second resin 31 is in contact with first resin 21 in the pores of the porous material. A material of second resin 31 is different from a material of first resin 21. The material of second resin 31 may be the same as the material of first resin 21.

In bonding step S12, second resin 31 has a higher melt viscosity than first resin 21. The melt viscosity of first resin 21 is the viscosity of first resin 21 that has been pressurized and heated to be a liquid. The melt viscosity of second resin 31 is the viscosity of second resin 31 that has been pressurized and heated to be a liquid. When the viscosity is high, the flow of the resin is suppressed.

In bonding step S12, second resin 31 has a higher curing rate than first resin 21. The curing rate of first resin 21 is a rate at which first resin 21 changes from liquid to gel. The curing rate of second resin 31 is a rate at which second resin 31 changes from liquid to gel. The curing rate may be measured with a Curelastometer as a measuring device. A temperature at which the curing rate is measured is, for example, 180° C.

Next, functions and effects of the present embodiment will be described.

Since the pores of the porous material are impregnated with second resin 31 in advance in impregnation step S13, first resin 21 that has entered the pores of the porous material of frame member 3 is further prevented from flowing out of frame member 3. Accordingly, the pressure applied to insulating resin layer 2 is further maintained. The voids are further suppressed. Thus, the insulation performance of semiconductor device 10 is further improved. In the present embodiment, first resin 21 and second resin 31 have a function as a wet seal. An effect of the wet seal in the present embodiment is greater than an effect of the wet seal in the first embodiment.

Since second resin 31 has a higher melt viscosity than first resin 21, the flow resistance received by first resin 21 in the porous material is larger than in the first embodiment. First resin 21 is further prevented from flowing out of frame member 3. Therefore, the insulation performance of semiconductor device 10 is further enhanced.

Since second resin 31 has a higher curing rate than first resin 21, second resin 31 has a high viscosity earlier than first resin 21 in the porous material. Thus, the flow resistance received at the porous material by first resin 21 is larger than in the first embodiment. First resin 21 is further prevented from flowing out of frame member 3. Therefore, the insulation performance of semiconductor device 10 is further enhanced.

Fourth Embodiment

In the present embodiment, the semiconductor device according to the first to third embodiments is applied to a power conversion device. Although the present invention is not limited to a specific power conversion device, a case where the present invention is applied to a three-phase inverter will be described below as a fourth embodiment.

Figure 18:
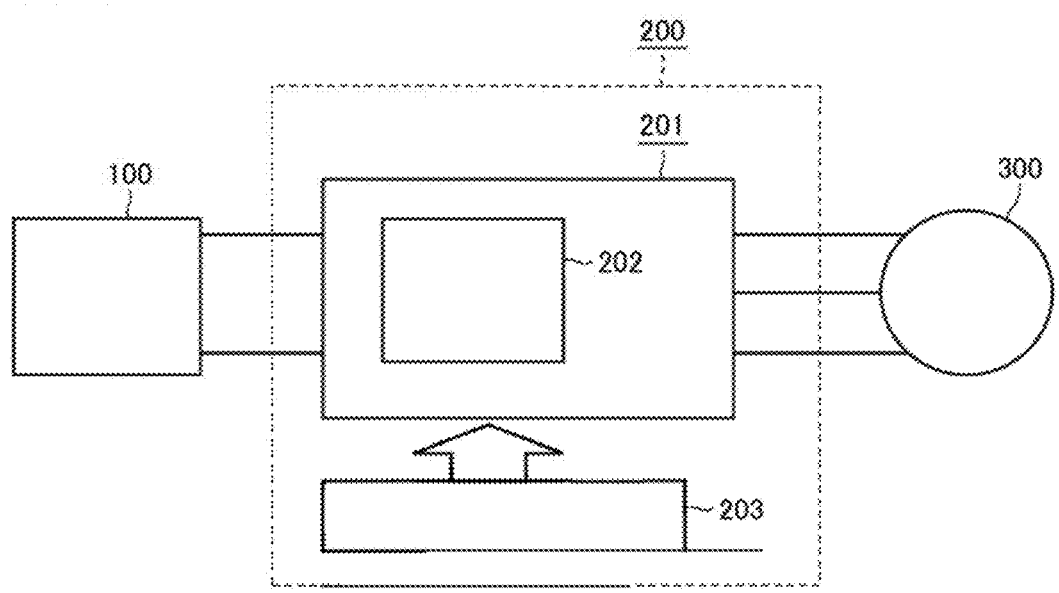
FIG. 18 is a block diagram illustrating a configuration of a power conversion system according to a fourth embodiment of the present invention.

FIG. 18 is a block diagram illustrating a configuration of a power conversion system to which the power conversion device according to the present embodiment is applied.

The power conversion system illustrated in FIG. 18 includes a power supply 100, a power conversion device 200, and a load 300. Power supply 100 is a DC power supply, and supplies DC power to power conversion device 200. Power supply 100 can include various components, and can include, for example, a DC system, a solar cell, and a storage battery, or may include a rectifier circuit or an AC/DC converter connected to an AC system. Power supply 100 may be configured by a DC/DC converter that converts DC power output from the DC system into predetermined power.

Power conversion device 200 is a three-phase inverter connected between power supply 100 and load 300, converts DC power supplied from power supply 100 into AC power, and supplies the AC power to load 300. As illustrated in FIG. 18, power conversion device 200 includes a main conversion circuit 201 that converts DC power into AC power and outputs the AC power, and a control circuit 203 that outputs a control signal controlling main conversion circuit 201 to main conversion circuit 201.

Load 300 is a three-phase electric motor driven by the AC power supplied from power conversion device 200. Load 300 is not limited to a specific application, but is an electric motor mounted on various electric devices, and is used as, for example, an electric motor for a hybrid vehicle, an electric vehicle, a railway vehicle, an elevator, or an air conditioner.

Hereinafter, details of power conversion device 200 will be described. Main conversion circuit 201 includes a switching element and a freewheeling diode (not illustrated), converts DC power supplied from power supply 100 into AC power by switching of the switching element, and supplies the AC power to load 300. Although there are various specific circuit configurations of main conversion circuit 201, main conversion circuit 201 according to the present embodiment is a two-level three-phase full bridge circuit, and can include six switching elements and six freewheeling diodes antiparallel to the respective switching elements. Each switching element and each freewheeling diode of main conversion circuit 201 are configured by a semiconductor device 202 corresponding to any one of the first to third embodiments. The six switching elements are connected in series for every two switching elements to constitute upper and lower arms, and each of the upper and lower arms constitutes each phase (U-phase, V-phase, and W-phase) of the full bridge circuit. Output terminals of the upper and lower arms, that is, three output terminals of main conversion circuit 201 are connected to load 300.

Further, main conversion circuit 201 includes a drive circuit (not illustrated) that drives each switching element. The drive circuit may be built in semiconductor device 202, or main conversion circuit 201 may include the drive circuit separately from semiconductor device 202. The drive circuit generates a drive signal for driving each switching element of main conversion circuit 201, and supplies the drive signal to a control electrode of each switching element of main conversion circuit 201. Specifically, in accordance with a control signal from control circuit 203 described later, a drive signal for turning on each switching element and a drive signal for turning off each switching element are output to the control electrode of each switching element. When the switching elements are maintained to be turned on, the drive signal is a voltage signal higher than or equal to a threshold voltage of the switching elements (ON signal), and when the switching elements are maintained to be turned off, the drive signal is a voltage signal lower than or equal to the threshold voltage of the switching elements (OFF signal).

Control circuit 203 controls the switching elements of main conversion circuit 201 such that desired power is supplied to the load 300. Specifically, a time (ON time) at which each switching element of main conversion circuit 201 is to be turned on is calculated on the basis of power to be supplied to load 300. For example, main conversion circuit 201 can be controlled by PWM control that modulates the ON time of the switching elements according to a voltage to be output. Then, a control command (control signal) is output to the drive circuit included in main conversion circuit 201 such that an ON signal is output to the switching elements to be turned on at each time point, and an OFF signal is output to the switching elements to be turned off at each time point. The drive circuit outputs an ON signal or an OFF signal as a drive signal to the control electrode of each switching element in accordance with the control signal.

In the power conversion device according to the present embodiment, the semiconductor module according to the first to third embodiments is applied as the switching elements and the freewheeling diode of main conversion circuit 201, and thus the insulation performance of the power conversion device can be enhanced.

In the present embodiment, an example in which the present invention is applied to a two-level three-phase inverter has been described, but the present invention is not limited thereto, and can be applied to various power conversion devices. In the present embodiment, the two-level power conversion device is used, but a three-level or multi-level power conversion device may be used, or the present invention may be applied to a single-phase inverter in a case where power is supplied to a single-phase load. When power is supplied to a DC load or the like, the present invention can also be applied to a DC/DC converter or an AC/DC converter.

The power conversion device to which the present invention is applied is not limited to the case where the load described above is an electric motor. For example, the power conversion device can be used as a power supply device of an electric discharge machine, a laser beam machine, an induction heating cooker, or a non-contact power feeding system, and can also be used as a power conditioner of a solar power generation system, a power storage system, or the like.

EXAMPLES

Next, Examples and Comparative Examples of the present invention will be described. Semiconductor device 10 according to Examples 1 and 2 is semiconductor device 10 according to the first embodiment. Semiconductor device 10 according to Example 3 is semiconductor device 10 according to the second embodiment. Semiconductor devices 10 according to Comparative Examples 1 and 2 are semiconductor device 10 according to Comparative Example.

Example 1

Example 1 is semiconductor device 10 according to the first embodiment. A material of semiconductor element 11 in Example 1 is silicon (Si). A material of heat spreader 12 in Example 1 is copper (Cu). Semiconductor element 11 and main terminal 15 are die bonded onto heat spreader 12. Semiconductor element 11, heat spreader 12, and main terminal 15 are transferred and molded by sealing resin 13. Thus, semiconductor module 1 is formed. Insulating resin layer 2 in Example 1 contains a thermally conductive filler and a thermosetting resin. The thermosetting resin in Example 1 is an epoxy resin. The thermally conductive filler in Example 1 is boron nitride (BN). A thermal conductivity of insulating resin layer 2 in Example 1 is 12 W/(m·K). The thickness of insulating resin layer 2 in Example 1 is 200 µm. Frame member 3 in Example 1 does not contain second resin 31.

A specification of frame member 3 in Example 1 is defined as a specification A. A material of frame member 3 of specification A is cellulose. Frame member 3 of specification A is constituted by cellulose as a whole. A pore diameter of the porous material of frame member 3 of specification A is 1 µm. The pore diameter of the porous material is the pore diameter before the porous material is compressed. A thickness of frame member 3 of specification A is 300 m. A tensile strength in the in-plane direction of frame member 3 of specification A is greater than or equal to 2 kg/mm². The second mechanical strength of frame member 3 of specification A is larger than the first mechanical strength. Frame member 3 of specification A is configured such that the compression ratio decreases as frame member 3 is compressed in the thickness direction. After insulating resin layer 2 and frame member 3 of specification A are compressed in bonding step S12, a ratio of the pores included in frame member 3 of specification A is 60% with respect to the volume of frame material 3 of specification A after deformation.

Example 2

Example 2 is semiconductor device 10 according to the first embodiment. Example 2 has the same configuration and manufacturing method as Example 1 unless otherwise specified. A specification of frame member 3 in Example 2 is defined as a specification B. Frame member 3 of specification B will be described only when being different from frame member 3 of specification A. A pore diameter of the porous material of frame member 3 of specification B is 7 µm. The pore diameter of the porous material of frame member 3 of specification B is larger than the pore diameter of the porous material of frame member 3 of specification A. After insulating resin layer 2 and frame member 3 of specification B are compressed in bonding step S12, a ratio of the pores included in frame member 3 of specification B is 55% with respect to the volume of frame member 3 of specification B after deformation.

Example 3

Example 3 is semiconductor device 10 according to the second embodiment. Example 3 has the same configuration and manufacturing method as Example 1 unless otherwise specified. A specification of frame member 3 in Example 3 is defined as a specification C. Frame member 3 of specification C will be described only when being different from frame member 3 of specification A. A material of frame member 3 of specification C is alumina. Frame member 3 of specification C is constituted by alumina fibers. The dielectric constant of frame member 3 of specification C is twice a dielectric constant of insulating resin layer 2. A pore diameter of the porous material of frame member 3 of the specification C is 10 µm. The pore diameter of the porous material of frame member 3 of specification C is larger than the pore diameter of the porous material of frame member 3 of specification A.

Example 4

Example 4 is semiconductor device 10 according to the third embodiment. Example 4 has the same configuration as Example 2 unless otherwise specified. As frame member 3 in Example 2, frame member 3 in Example 4 is frame member 3 of specification B. The method of manufacturing semiconductor device 10 according to Example 4 further includes impregnation step S13. In Example 4, impregnation step S13 is performed before arrangement step S11. In impregnation step S13, frame member 3 of specification B further contains second resin 31. A specification of second resin 31 in Example 4 is defined as a specification D. Second resin 31 of specification D is a high-viscosity resin. A material of second resin 31 of specification D is an epoxy resin. The epoxy resin as the material of second resin 31 of specification D is different from the epoxy resin as the material of the thermosetting resin of insulating resin layer 2. Specifically, the melt viscosity of the epoxy resin as the material of second resin 31 of specification D is higher than the melt viscosity of the epoxy resin as the thermosetting resin of insulating resin layer 2 to be first resin 21. In impregnation step S13, 50% of the volume of the pores of the porous material is impregnated with second resin 31 of specification D.

Example 5

Example 5 is semiconductor device 10 according to the third embodiment. Example 5 has the same configuration as Example 4 unless otherwise specified. As frame member 3 in Example 4, frame member 3 in Example 5 is frame member 3 of specification B. A specification of second resin 31 in Example 5 is defined as a specification E. Second resin 31 of specification E is a high-curing rate resin. A curing rate of second resin 31 of specification E is higher than a curing rate of first resin 21.

Comparative Example 1

Comparative Example 1 is semiconductor device 10 according to Comparative Example. Comparative Example 1 has the same configuration as Example 1 unless otherwise specified. Comparative Example 1 is different from Example 1 in that frame member 3 is not provided.

Comparative Example 2

Comparative Example 2 is semiconductor device 10 according to Comparative Example. Comparative Example 2 has the same configuration as Comparative Example 1 unless otherwise specified. Comparative Example 2 is different from Example 1 in that Comparative Example 2 includes first resin 21 different from that of Comparative Example 1. A specification of first resin 21 in Comparative Example 2 is defined as a specification F. A first melt viscosity of first resin 21 of specification F is ten times larger than a first melt viscosity of first resin 21 in Comparative Example 2.

Next, evaluation results of Examples 1 to 5 and Comparative Examples 1 and 2 are shown in Table 1.

performance of Example 3 was evaluated as a. The adhesiveness of Example 3 was evaluated as a. The resin outflow suppression of Example 4 was evaluated as b. The insulation performance of Example 4 was evaluated as a. The adhesiveness of Example 4 was evaluated as a. The resin outflow suppression of Example 5 was evaluated as a. The insulation performance of Example 5 was evaluated as a. The adhesiveness of Example 5 was evaluated as a. The resin outflow suppression of Comparative Example 1 was evaluated as d. The insulation performance of Comparative Example 1 was evaluated as d. The adhesiveness of Comparative Example 6 was evaluated as a. The resin outflow suppression of Comparative Example 1 was evaluated as b. The insulation performance of Comparative Example 7 was evaluated as c. The adhesiveness of Comparative Example 7 was evaluated as c.

The insulation performance and adhesiveness are the most important necessary functions of insulating resin layer 2. In

TABLE 1

| | | | Outer frame | | | Insulating resin layer | | Evaluation results | | |
| --- | --- | --- | --- | --- | --- | --- | --- | --- | --- | --- |
| | | | Pore diameter | Porosity | | | | | | |
| Embodiment | Specification | Material | before pressing | after pressing | Second resin | Configuration | Resin viscosity | Resin outflow | Pressure resistance | Adhesiveness |
| Example 1 | 1 | A | Cellulose | 1 μm | 60% | Absent | Filler/resin | Low | a | a | a |
| Example 2 | | B | Cellulose | 7 μm | 55% | Absent | Filler/resin | Low | c | b | a |
| Example 3 | 2 | C | Alumina | 10 μm | 60% | Absent | Filler/resin | Low | c | a | a |
| Example 4 | 3 | B | Cellulose | 7 μm | 55% | High viscosity | Filler/resin | Low | b | a | a |
| Example 5 | | B | Cellulose | 7 μm | 55% | High curing rate | Filler/resin | Low | a | a | a |
| Comparative Example 1 | | | | Absent | | | Filler/resin | Low | d | d | a |
| Comparative Example 2 | | | | Absent | | | Filler/resin | High | b | c | c |

Evaluation criteria
a: Greater than 100% of target value.
b: 100% of target value.
c: Greater than or equal to 70% of target value and less than 100% of target value.
d: Less than 70% of target value.

The evaluation was made on resin outflow suppression (resin outflow), insulation performance (pressure resistance), and adhesiveness. An amount of outflow of first resin 21 and second resin 31 from frame member 3 was observed in appearance to evaluate the resin outflow suppression. The insulation performance between semiconductor module 1 and heat sink 4 was evaluated. The adhesiveness between semiconductor module 1 and the heat sink was evaluated. The adhesiveness was evaluated using an ultrasonic flaw detector (SAT).

Evaluation criteria have four stages of evaluation a to d. Evaluation a indicates that the result is greater than 100% of a target value. Evaluation b indicates that the result is 100% of the target value. Evaluation c indicates that the result is greater than or equal to 70% of the target value and less than 100% of the target value. Evaluation d indicates that the result is less than 70% of the target value.

As shown in Table 1, the resin outflow suppression of Example 1 was evaluated as a. The insulation performance of Example 1 was evaluated as a. The adhesiveness of Example 1 was evaluated as a. The resin outflow suppression of Example 2 was evaluated as c. The insulation performance of Example 2 was evaluated as b. The adhesiveness of Example 2 was evaluated as a. The resin outflow suppression of Example 3 was evaluated as c. The insulation each of Example 1 to 5, good evaluation was obtained for the insulation performance and the adhesiveness. In Example 1, the resin outflow suppression was excellent. In Example 1, the insulation performance was excellent. In Example 1, the adhesiveness was good. In Example 2, the resin slightly flowed out. The outflow of the resin in Example 2 was within an allowable range. In Example 2, the insulation performance was good. In Example 2, the adhesiveness was excellent. In Example 3, the resin outflow suppression was high. In Example 3, the insulation performance and the adhesiveness were excellent. The results of Example 4 were similar to the results of Example 3. In Example 4, the resin outflow suppression was high. In Example 4, the insulation performance and the adhesiveness were excellent. In Example 5, the resin outflow suppression, the insulation performance, and the adhesiveness were good. The insulation performance of Example 5 was the highest among Examples. As described in the third embodiment, the insulation performance of semiconductor device 10 was further improved by impregnating the pores of the porous material of frame member 3 with second resin 31.

In Comparative Example 1, insulating resin layer 2 largely flowed out from below semiconductor module 1. The insulation performance of Comparative Example 1 is low.

In Comparative Example 2, since the melt viscosity of first resin 21 of specification F is high, resin outflow suppression is high. Since the melt viscosity of first resin 21 of specification F is high, it is necessary to apply a high pressure to insulating resin layer 2 in order to firmly bond insulating resin layer 2. In Comparative Example 2, since frame member 3 is not present, the pressure cannot be sufficiently increased. Therefore, the insulation performance and the adhesiveness are low.

In Comparative Examples 1 and 2, since insulating resin layer 2 flows out when pressurized and heated, the internal pressure does not increase at the end. Therefore, since the voids remain in insulating resin layer 2, the insulation performance is low.

It should be understood that the embodiments and Examples disclosed herein are illustrative in all respects and not restrictive. The scope of the present invention is defined not by the above description but by the claims, and is intended to include meanings equivalent to the claims and all modifications within the scope.

REFERENCE SIGNS LIST

1: Semiconductor module, 2: Insulating resin layer, 3: Frame member, 4: Heat sink, 10: Semiconductor device, 21: First resin, 31: Second resin, 100: Power supply, 200: Power conversion device, 201: Main conversion circuit, 202: Semiconductor device, 203: Control circuit, 300: Load

The invention claimed is:

1. A semiconductor device comprising:
a semiconductor module;
an insulating resin layer bonded to the semiconductor module and containing a first resin;
a frame member disposed to surround the insulating resin layer and including a porous material; and
a heat sink sandwiching the insulating resin layer and the frame member between the semiconductor module and the heat sink, wherein
the frame member is compressed in a state of being sandwiched between the semiconductor module and the heat sink,
the insulating resin layer is filled in a region surrounded by the semiconductor module, the heat sink, and the frame member, and
the first resin enters a pore of the porous material.

2. The semiconductor device according to claim 1, wherein
the frame member has a first mechanical strength in a direction from the semiconductor module toward the heat sink and a second mechanical strength in a plane orthogonal to the direction from the semiconductor module toward the heat sink, and
the second mechanical strength is larger than the first mechanical strength.

3. The semiconductor device according to claim 1, wherein the frame member is configured for a compression ratio to decrease as the frame member is compressed in a thickness direction.

4. The semiconductor device according to claim 1, wherein the insulating resin layer includes a thermally conductive filler having a pore of a filler.

5. The semiconductor device according to claim 4, wherein the pore of the porous material has a volume ratio that is smaller than a volume ratio of the pore of the filler.

6. The semiconductor device according to claim 4, wherein a pore diameter of the porous material is smaller than a particle diameter of the filler.

7. The semiconductor device according to claim 4, wherein the pore diameter of the porous material is smaller than a pore diameter of the filler.

8. The semiconductor device according to claim 1, wherein the frame member is constituted by a material that is at least one of natural fiber, glass fiber, polymer material fiber, inorganic fiber, or nonwoven fabric.

9. The semiconductor device according to claim 8, wherein
the frame member has a tensile strength in an in-plane direction, and
the tensile strength is greater than or equal to 2 kg/mm$^2$.

10. The semiconductor device according to claim 8, wherein the frame member is an insulator.

11. The semiconductor device according to claim 8, wherein
the insulating resin layer has a first dielectric constant,
the frame member has a second dielectric constant, and
the second dielectric constant is larger than the first dielectric constant.

12. The semiconductor device according to claim 11, wherein the frame member is constituted by a material that is at least one of alumina or mullite.

13. A power conversion device comprising:
a main conversion circuit to convert and output input power, the main conversion circuit including the semiconductor device described in claim 1; and
a control circuit to output a control signal controlling the main conversion circuit to the main conversion circuit.

14. A method of manufacturing a semiconductor device comprising:
arranging an insulating resin layer and a frame member surrounding the insulating resin layer and including a porous material to be sandwiched between a semiconductor module and a heat sink in an arrangement step; and
compressing the insulating resin layer and the frame member and bonding the semiconductor module and the heat sink to the insulating resin layer in a bonding step, wherein
in the bonding step, the insulating resin layer is filled in a region surrounded by the semiconductor module, the heat sink, and the frame member and contains a first resin, and the first resin enters a pore of the porous material.

15. The method of manufacturing a semiconductor device according to claim 14, further comprising impregnating the pore of the porous material with a second resin in an impregnation step, wherein
in the bonding step, the first resin is in contact with the second resin.

16. The method of manufacturing a semiconductor device according to claim 15, wherein in the bonding step, the second resin has a higher melt viscosity than the first resin.

17. The method of manufacturing a semiconductor device according to claim 15, wherein in the bonding step, the second resin has a higher curing rate than the first resin.

* * * * *